United States Patent [19]
Koletar

[11] Patent Number: 5,686,221
[45] Date of Patent: Nov. 11, 1997

[54] NEGATIVE WORKING PEEL APART COLOR PROOFING PROCESS

[75] Inventor: Gabor L Koletar, Berkeley Heights, N.J.

[73] Assignee: Bayer Corporation, Pittsburgh, Pa.

[21] Appl. No.: 579,658

[22] Filed: Dec. 27, 1995

[51] Int. Cl.$^6$ .................................................. G03F 7/34
[52] U.S. Cl. ........................ 430/254; 430/253; 430/257; 430/293; 430/143
[58] Field of Search .................................... 430/253, 254, 430/293, 143, 257

[56] References Cited

U.S. PATENT DOCUMENTS

| | | | |
|---|---|---|---|
| 4,910,120 | 3/1990 | Platzer et al. | 430/253 |
| 4,963,462 | 10/1990 | Wilczak | 430/143 |
| 5,049,476 | 9/1991 | Platzer | 430/253 |
| 5,108,868 | 4/1992 | Platzer | 430/143 |
| 5,300,399 | 4/1994 | Wilczak | 430/253 |

*Primary Examiner*—Christopher G. Young
*Attorney, Agent, or Firm*—Richard S. Roberts

[57] ABSTRACT

A negative-acting color proofing method provides a photosensitive element having a cover sheet; release layer having a polymer with phenolic groups; color layer having a binder, polymerizable monomer, colorant, and optional photoinitiator; a photoadhering layer, having a photosensitive polymer having unsaturated, photocrosslinkable groups and a molecular weight greater than about 3,000, a polymerizable monomer having at least one unsaturated group, and an optional photoinitiator. A at least one of the color layer and the photoadhering layer has a photoinitiator; and a first thermoplastic adhesive layer. A photomask is applied onto the thermoplastic adhesive layer and one imagewise exposes the color layer and photoadhering layers to actinic radiation through the photomask. After removing the photomask, the photosensitive element is laminated to a temporary receiver. After peeling apart the temporary receiver and the cover sheet, exposed areas of the color layer attach to the temporary receiver and unexposed areas are removed with the cover sheet thereby forming a colored negative image on the temporary receiver sheet. These steps are optionally repeated with another photosensitive element having a different colorant and adhere an image to the image previously produced on the temporary receiver sheet. The temporary receiver sheet is laminated to a permanent receiver sheet via the images with heat and pressure. The temporary receiver sheet is optionally removed.

23 Claims, No Drawings

NEGATIVE WORKING PEEL APART COLOR PROOFING PROCESS

BACKGROUND OF THE INVENTION

1. Field of the Invention

The invention pertains to color proofing films, or more particularly to negative working, peel-apart photosensitive elements which are useful for producing multicolored negative images on a single receiver sheet by successive imagewise exposures to actinic radiation and peel developments.

2. Description of the Prior Art

In the field of lithographic printing, it is desirable to produce a multicolor proof to assist a printer in correcting a set of color separation films prior to using them to produce printing plates. The proof should accurately reproduce the color quality that is to be obtained during the printing process. Visual examination of the color proof should show the color rendition expected from press printing using the color separations as well as any defects which might need to be altered before making the printing plates.

It is known to produce color proofs for multicolor printing by using a printing press or proof press. However, this requires that all of the actual printing steps be performed including making expensive metal printing plates. As a result, this conventional method of color proofing is costly and time consuming. Photoimaging processes can also be used to produce a color proof. There are two general types of photoimaging methods, namely the overlay type and the single sheet type.

In the overlay type of color proofing, an independent transparent plastic support is used for producing a partial image for each color separation film of the corresponding color. A series of these supports carrying images of the analogous colors are then superimposed on each other over a white sheet to produce a color proofing composite. Such overlay proofs can be made quickly and can serve as a progressive proof by combining any two or more colors in register. However, this type of color proofing has the disadvantage that the superimposed plastic supports tend to darken the color proofing image. As a result, the impression of the color proofing composite thus prepared is markedly different from that of copies actually obtained with conventional printing presses and with proof presses. Examples of such overlay films are shown in U.S. Pat. Nos. 3,136,637; 3,211,553; and 3,326,682.

In the single sheet type of color proofing, a color proofing image is prepared by successively producing images of different colors from different color separation films on a single receiver sheet. This is done by sequentially applying colorants or colored, photosensitive layers to a single opaque support. This method more closely resembles the actual printing process and eliminates the color distortion inherent from the multiple plastic supports in the overlay system. Examples of such single sheet films may be seen in U.S. Pat. Nos. 3,574,049; 3,671,236; 4,260,673; 4,366,223; 4,650,738; 4,656,114; and 4,659,642.

Many processes for producing single sheet color proofs of an image are known in the art. See, for example U.S. Pat. Nos. 3,060,023; 3,060,024; 3,060,025; 3,481,736; and 3,607,264. In these processes, a photopolymerizable layer on a support is imagewise exposed through a color separation film. The surface of the exposed layer is then pressed into contact with an image receptive surface of a separate element. One of the elements is heated to a temperature above the transfer temperature of the unexposed portions of the layer. The two elements are then separated and the thermally transferrable, unexposed, image areas of the composite transfer to the image receptive element. If the element is not precolored, the tacky unexposed image may now be selectively colored with a desired toner. The colored toner preferentially adheres to the clear unpolymerized material.

U.S. Pat. No. 3,721,557 discloses a method for transferring colored images which provides a stripping layer between a photosensitive element and a support. An additional layer of adhesive must be applied to the receptor for each subsequent transfer. U.S. Pat. No. 4,596,757 provides a method for transferring images or solid colors which are subsequently imaged. The latter photosensitive material uses a wet development process.

Peel apart color proofing systems are also well known. U.S. Pat. Nos. 4,963,462; 5,049,476; 4,910,120 and 5,108,868, which are incorporated herein by reference, disclose peel developable, single sheet color proofing systems. U.S. Pat. No. 5,300,399 discloses a peel apart color proofing systems using an element similar to that of the present invention to produce a negative-acting color proofing film. This element sequentially comprises a strippable cover sheet which is transparent to actinic radiation; a crosslinked release layer; a color layer; a photoadhering layer; a thermoplastic adhesive layer; and a receiver sheet. At least one of the color layer and the photoadhering layer contains a photoinitiator. A single sheet, negative working color proofing film having good image quality with high resolution is produced when exposed through the strippable cover sheet. The present invention produces an improved image using such an element using an alternate image forming method wherein exposure of the color layer and photoadhering layer is done through the thermoplastic adhesive layer rather than through the cover sheet. By the method of the present invention, a wider exposure latitude and better image resolution are obtained.

SUMMARY OF THE INVENTION

The invention provides a method for producing a negative image which comprises:

(A) providing a photosensitive element which comprises, in order from top to bottom:
   (i) a dimensionally stable cover sheet;
   (ii) a crosslinked release layer adhered to the cover sheet, which release layer comprises a polymer having phenolic groups;
   (iii) a color layer, which comprises an organic binder, an unsaturated monomer capable of addition polymerization, a colorant, and optionally, a photoinitiator, wherein the binder is present in sufficient amount to bind the color layer components into a uniform film, wherein the optional photoinitiator, when present, is present in a sufficient amount to initiate polymerization of the polymerizable monomer, wherein the polymerizable monomer is present in sufficient amount to provide image differentiation when the element is imagewise exposed to actinic radiation and wherein the colorant is present in an amount sufficient to uniformly color the color layer;
   (iv) a photoadhering layer, which comprises a photosensitive polymer having ethylenically unsaturated, photocrosslinkable groups and a molecular weight greater than about 3,000, a polymerizable monomer having at least one ethylenically unsaturated group, and an optional photoinitiator, wherein the optional photoinitiator, when present, is present in sufficient amount to initiate polymerization of the polymerizable monomer and the crosslinking of the photosensitive polymer; and wherein at least one of either the color layer and the photoadhering layer contains a photoinitiator; and (v) a first thermoplastic adhesive layer;

(B) positioning a photomask onto the first thermoplastic adhesive layer and imagewise exposing the color layer and the photoadhering layer to actinic radiation through the first thermoplastic adhesive layer and photomask;

(C) removing the photomask from the photosensitive element;

(D) laminating the photosensitive element to a temporary receiver sheet, which temporary receiver sheet comprises a smooth substrate having a second thermoplastic adhesive layer thereon, said lamination being conducted by adhering the first thermoplastic adhesive layer to the second thermoplastic adhesive layer with heat and pressure;

(E) peeling apart the temporary receiver sheet and the cover sheet, leaving exposed areas of the color layer attached to the temporary receiver sheet via the photoadhering layer and first and second adhesive layers and the unexposed areas being removed with the cover sheet and the crosslinked phenolic layer, thereby forming a colored negative image on the temporary receiver sheet; and (F) optionally repeating steps (A) through (E) at least once wherein another photosensitive element having at least one different colorant, is transferred via its photoadhering and first thermoplastic adhesive layers to the image previously produced on the temporary receiver sheet; and (G) laminating the temporary receiver sheet to a permanent receiver sheet via the images with heat and pressure;

(H) optionally overall exposing the image to actinic radiation;

(I) optionally peeling away the substrate of the temporary receiver sheet.

DETAILED DESCRIPTION OF THE PREFERRED EMBODIMENT

One begins the process of the present invention by preparing a photosensitive element which comprises in order, a strippable cover sheet; a crosslinked release layer comprising a polymer having phenolic groups; a color layer having an organic binder, polymerizable monomer, colorant, and optional photoinitiator; a photoadhering layer; and a first thermoplastic adhesive layer.

In the preferred embodiment, the strippable cover sheet may be composed of any suitable flexible, dimensionally, stable sheet material. It may be transparent to the actinic radiation but it is not necessarily transparent. In the preferred embodiment, it has a surface which is dimensionally stable when undergoing the herein specified treatment processes. That is, it should have substantially no change in dimensions under heating in the range of from about 60° C. to about 120° C. during lamination. One preferred cover sheet material is polyethylene terephthalate. In the preferred embodiment, the cover sheet has a thickness of from about 1 to about 10 mils, more preferably from about 2 to about 5 mils and most preferably from about 2 to about 3 mils. Suitable cover sheets nonexclusively include Melinex 054, 504, 505, and 582 films available from ICI, and Hostaphan 4400, 4500, and 4540 films available from Hoechst Celanese Corporation. The surface of the cover sheet may be smooth or it may be provided with a matte texture as with Melinex 475 film. A smooth surface is preferred.

The cover sheet has thereon a crosslinked release layer having phenolic groups. The phenolic polymer can be a novolak or cresol-formaldehyde resin, polyhydroxystyrene homo- and co-polymers, acrylic polymers containing phenolic groups, etc. The phenolic containing release layer is applied from a solvent coating composition to the cover sheet. Solvents include organic solvents as well as water. Crosslinking of the polymer can be achieved by the use of polyisocyanates, melamine-formaldehyde resins, urea-formaldehyde resins, epoxy resins, aziridine resins, and heat, acrylic monomers and light, etc., in a manner well known in the art. The crosslinked phenolic layer should be insoluble in solvents used to coat subsequent layers.

Applied to the release layer is a color layer which comprises an organic binder, an unsaturated monomer capable of addition polymerization, a colorant, and optionally, a photoinitiator. The color layer contains a binding resin which determines the hardness and/or flexibility of the coating as well as controlling dry development. Binding resins suitable for the color layer are polyvinyl acetates, styrene/maleic anhydride copolymers and their half esters, acrylic polymers and copolymers, polyamides, polyvinyl pyrrolidones, cellulose and its derivatives, phenolic resins; and the like. The most preferred binding resins are polyvinyl acetates and acetals, such as UCAR resins available from Union Carbide, polyvinyl formal, polyvinyl butyral and polyvinyl propional. In the preferred embodiment, the binder component is preferably present in the color layer in an amount sufficient to bind the components in a uniform mixture and a uniform film when it is coated onto a substrate. It is preferably present in an amount ranging from about 10 to about 90% based on the weight of the solids in the color layer. A more preferred range is from about 20 to about 80%.

The polymerizable monomers in the color layer and in the photoadhering layer preferably comprise addition polymerizable, non-gaseous (boiling temperature above 100° C. at normal atmospheric pressure), ethylenically-unsaturated compounds containing at least one and preferably at least two terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate. The monomers in the color and photoadhering layers can be the same or different. In the preferred embodiment, the polymerizable monomer is present in the color layer in an amount of from about 1 to about 60% by weight of the total solids in the color layer, more preferably from about 5% to about 50%.

Free radical liberating photoinitiators used in the color layer and/or photoadhering layer include any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon-substituted aromatic acyloins in U.S. Pat. No. 2,722,512; polynuclear quinones in U.S. Pat. Nos. 2,951,758 and 3,046,127; and s-triazines in U.S. Pat. Nos. 3,987,037 and 4,189,323. The most preferred photoinitiators include 2,3-di(4-methoxyphenyl)quinoxaline, 9-phenylacridine, 2-biphenyl-4,6-bis-trichloromethyl-5-triazine, bis(2,4,5-triphenyl)imidazole and its derivatives, bis-trichloromethyl-s-triazines, thioxanthones and acetophenones. The photoinitiator used in the color and/or photoadhering layer may be the same or different. In the practice of the present invention, the photoinitiator component, when used in the color layer, is preferably present in an amount ranging from about 0.01 to 20% based on the weight of the solids in the layer. A preferred range is from about 0.1 to 15%, more preferably from 1 to 10%.

Dyes and/or pigments are included in the color layer to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer. Nonexclusive examples of colorants usable in the present invention are as follows: Permanent Yellow G (C.I. 21095), Permanent Yellow GR (C.I. 21100), Permanent Yellow DHG (C. I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color. Dyes which may be included in the color layer to spectrally sensitize the photoinitiator, such as described in U.S. Pat. Nos. 4,282,309 and 4,454,218, and European Patent Applications 0,179,448 and 0,211,615. In the practice of the present invention, the colorant component is preferably present in an amount sufficient to uniformly color the color layer. It is preferably present in an amount ranging from about 5 to about 50% based on the weight of the solids in the color layer. A more preferred range is from about 8 to about 40%.

The color layer components are applied from a solvent coating composition to the crosslinked phenolic layer and dried. Organic solvents are preferred for the color layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone. In the preferred embodiment the dried color layer has a coating weight range of from about 0.1 to about 5 g/m², preferably from about 0.4 to about 2 g/cm². The crosslinked phenolic layer has a preferred coating weight ranging from about 0.1 to about 5 g/m², preferably from about 0.4 to 1.0 g/m².

Other ingredients which may be present in the color layer non-exclusively include thermal polymerization inhibitors, plasticizers, tackifiers, oligomers, residual solvents, surfactants, inert fillers, antihalation agents, hydrogen atom donors, photoactivators, and optical brightening agents, in amounts readily determinable by those skilled in the art.

A plasticizer may also be included in the color or photoadhering layer of this invention to prevent coating brittleness and to keep the composition pliable if desired. Suitable plasticizers include dialkyl phthalates such as dibutylphthalate, triarylphosphate and substituted analogs thereof such as dioctylphthalate and polymeric plasticizers such as Resoflex 296, available from Cambridge Industries, in amounts easily determined by those skilled in the art.

Adhered to the color layer is the photoadhering layer. The photoadhering layer preferably comprises a photosensitive polymer, a photoinitiator, and a polymerizable monomer. The photoinitiator and a polymerizable monomer may be components as hereinbefore defined as useful for the color layer.

Suitable photosensitive polymers have ethylenically unsaturated, photocrosslinkable groups and a molecular weight greater than about 3,000. Such nonexclusively include an acrylated or methacrylated containing polymer. Suitable photosensitive polymers include a urethane adduct of polyvinyl butyral or other acetal resins containing hydroxy groups and isocyanatoethyl methacrylate, or the reaction product of hydroxy containing acetal resins with acrylic anhydride, methacrylic anhydride, acrylic acid, methacrylic acid or acryloyl chloride, acrylated or methacrylated polyvinyl acetal polymers, etc. Acrylic polymers containing hydroxy groups can also be used as substrates with all the above (meth)acrylic groups-containing reagents, as can polyvinyl alcohols and their copolymers, phenolic resins, etc. Other reactive groups of polymers which can be (meth)acrylated nonexclusively include amino, carboxyl, epoxy, etc. The (meth)acrylated polyvinyl acetal polymers are preferred. The photoadhering layer may optionally contain a uv absorber such as Tinuvins from Ciba-Geigy or Uvinuls such as Uvinul D-50 available from GAF. It may also contain a plasticizer such as Resoflex R-296, available from Cambridge Industries. It may also contain antistatic compounds, such as Gafac and Gafstat available from GAF.

The photosensitive polymer may be present in the photoadhering layer in an amount of from about 1% to about 30% based on the weight of the solids in the layer. A preferred range is from about 3% to about 20% and more preferably from about 5% to about 15%.

In the preferred embodiment, the polymerizable monomer is present in the photoadhering layer from 1 to about 50% by weight of the total solids in photoadhering layer, more preferably from about 10 to about 40%. In the practice of the invention, the optional photoinitiator component is preferably present in the photoadhering layer in an amount ranging from about 1% to 40% based on the weight of the solids in the layer. A preferred range is from about 2% to about 30%, more preferably from about 5% to about 20%.

To form the photoadhering layer, the components may be dissolved in a solvent or mixture of solvents to facilitate application of the composition to the color layer. Suitable solvents for this purpose nonexclusively include water, tetrahydrofuran, n-butyl acetate, isobutyl isobutyrate, glycol ethers such as propylene glycol monomethyl ether and methyl Cellosolve, alcohols such as ethanol and n-propanol and ketones such as methyl ethyl ketone. In general, the solvent system is evaporated from the coating composition once it is applied to the color layer. However, some insignificant amount of solvent may remain as residue. In addition, the monomer from the photoadhering layer tends to diffuse into the color layer during overcoating process, so one way of providing the color layer with the monomer is not to include it in the coating solution of the color layer, but let it migrate there from the photoadhering layer during coating and drying process, or during lamination of the layers. This process of monomer migration via diffusion is known to those skilled in the art of creating multilayer imaging systems. According to the present invention, it is important that the monomer be present in the color layer when the element is exposed to actinic radiation, regardless of the way it became the part of the color layer. In the preferred embodiment, the photoadhering layer has a dried coating weight of from about 2 to about 20 g/m$^2$. The most preferred weight is from about 4 to about 10 g/m$^2$.

The photoadhering layer may optionally contain such other desired components as uv absorbers, antistatic compositions, optical brighteners, inert fillers, thermal polymerizable inhibitors, residual solvents, surfactants, antihalation agents, hydrogen atom donors, tackifiers, and plasticizers. Such compounds and their amounts may be readily determined by those skilled in the art.

On the photoadhering layer is a thermally activated, first thermoplastic adhesive layer which should be coated directly on the photoadhering layer. The first thermoplastic adhesive layer comprises a thermoplastic resin. Nonexclusive examples thermoplastic resins include Carboset acrylic resins, polyvinyl acetate/crotinic acid copolymers, polyvinyl pyrrolidone/polyvinyl acetate copolymers, polyvinyl acetate emulsions, styrene/maleic anhydride copolymers, urethane polymers, etc. The first thermoplastic adhesive layer may contain a plasticizer such as dialkyl phthalates, triaryl phosphates or polymeric plasticizers such as Resoflex 296, available from Cambridge Industries; and a uv absorber such as Tinuvins from Ciba-Geigy or Uvinuls from GAF. The plasticizer may be present in an amount of up to about 10% by weight and the uv absorber up to about 10% by weight. The first thermoplastic adhesive layer should be coated from a solvent which does not disturb the photoadhering layer underneath. Water is the preferred solvent. The dried coating weight of the first thermoplastic adhesive layer should be from about 2 to about 20 g/m2, more preferably from about 5 to about 15 g/m2, and most preferably from about 6 to about 10 g/m2.

The first thermoplastic adhesive layer should be transferable by lamination to a temporary receiver sheet in a temperature range of from about 50° C. to about 180° C., preferably from about 60° C. to about 120° C., more preferably from about 60° C. to about 100° C. when laminated with such heat and pressure.

Under ambient room temperature conditions, the first thermoplastic adhesive layer is substantially nontacky. The photosensitive element is imaged by positioning a photomask onto the first thermoplastic adhesive layer and imagewise exposing the color layer and the photoadhering layer to actinic radiation through the first thermoplastic adhesive layer and the photomask.

The element is exposed by means well known in the art. Such exposure may be conducted by exposure to actinic radiation from a light source under vacuum frame conditions. Mercury vapor discharge lamps are the preferred source of actinic radiation. Other radiation sources such as metal halide lamps, carbon arc, pulsed xenon, and lasers, may also be used. Light absorbing filters may be used to reduce light scattering in the materials. The photomask is then simply removed from the nontacky first thermoplastic adhesive layer surface of the photosensitive element. The photosensitive element layers remain intact and it has a latent image thereon.

The photosensitive element is then laminated to a temporary receiver sheet. Temporary receiver sheets may comprise virtually any substrate material which can withstand the laminating and dry development processes. White plastic sheets, such as adhesion pretreated polyester Melinex 3020 film available from ICI, are useful for this purpose. Plastic coated paper sheets, such as polyethylene coated paper available from Schoeller, may also be used. Other bases may include wood, glass, metal, paper and the like. The temporary receiver sheet substrate contains a thermally activated second thermoplastic adhesive layer thereon which may be any of the compositions mentioned above as suitable for the first thermoplastic adhesive layer which was applied onto the photoadhering layer.

Lamination may be conducted by putting the first thermoplastic adhesive layer of the photosensitive element in contact with the second thermoplastic adhesive layer of the temporary receiver sheet receiver sheet and then introducing the materials into the nip of a pair of heated laminating rollers under suitable pressure. Suitable laminating temperatures usually range from about 60° C. to about 120° C., preferably from about 70° C. to about 100° C.

After lamination, an image is formed by peeling apart the temporary receiver sheet and the cover sheet, leaving exposed areas of the color layer attached to the temporary receiver sheet via the photoadhering layer and first and second adhesive layers and the unexposed areas being removed with the cover sheet and the crosslinked phenolic layer, thereby forming a colored negative image on the temporary receiver sheet. Stripping the transparent cover sheet from the receiver sheet is done by simply peeling apart with the fingers at room temperature with a steady, continuous motion. The preferred peel angle relative to the peel direction is greater than about 90°.

The peel apart delamination leaves the photoexposed areas of the color layer attached to the photoadhering layer, which in its entirety is attached to the temporary receiver sheet via the first and second adhesive layers on the receiver sheet. The nonexposed areas of the color layer remain on the phenolic layer which remains entirely on the cover sheet which has been peeled apart from the receiver sheet. Thus, a negative image remains on the receiver sheet.

In order to attain a multicolored image, another photosensitive element comprising, in order, a transparent cover sheet, crosslinked phenolic layer, a color layer having a different color, a photoadhering layer and a first thermoplastic adhesive layer is likewise exposed through its first thermoplastic adhesive layer through another color separated exposure mask. After removing this next exposure mask this element is laminated in register onto the first image onto the temporary receiver sheet. The second color is dry developed by peeling apart the temporary receiver sheet from the cover sheet of the additional photosensitive element. The second negative image remains with its photosensitive adhesive layer and first thermoplastic adhesive layers on the first image. A third and a fourth image may be added in a manner similar to that used to produce the second image. In the usual case, four colored layers are employed to produce a full color reproduction of a desired image. These four colors are cyan, magenta, yellow and black.

Up to this point, all of the foregoing images are wrong-reading, i.e. mirror-image representations of the desired image. In order to reverse the mirror-image to right reading, the temporary receiver sheet is then laminated in a similar fashion to a permanent receiver sheet via the images with heat and pressure. This latter lamination and transfer turns the image around to provide a right-reading image on the final permanent receiver sheet. Permanent receiver sheets may comprise any dimensionally stable substrate material described above as useful for the cover sheet or the substrate of the temporary receiver sheet. In addition, one may optionally peel away the substrate of the temporary receiver sheet. Preferably the permanent receiver sheet is an opaque white and the temporary receiver sheet is transparent, although these are not required.

A matte finish of the final image may be obtained by embossing a shiny, top surface of the image with a matte material, such as Melinex 377 film available from ICI. This is done by laminating together the final image and matte material and peeling the matte material away.

It has been found that by following the image forming procedure of this invention, that improved image resolution and exposure latitude are obtained compared to forming an image by exposing a similar photosensitive element through the cover sheet and transferring an image directly from the photosensitive element to a permanent receiver sheet.

The following nonlimiting examples serve to illustrate the invention.

EXAMPLE 1

This example shows the preparation of the photosensitive element used in the present invention.

Phenolic Release Layer

A phenolic layer solution was formed by combining 47 g of methyl ethyl ketone (MEK); 47 g of Dowanol PM; 3 g of poly-p-hydroxystyrene (6,200 MW, available from Hoechst Celanese Corporation); 1 g of melamine-formaldehyde resin (Cymel 303, Cyanamid); and 0.2 g of p-toluene sulfonic acid. This solution was coated onto Melinex 505, 2 mil polyester available from ICI to coating weight of 0.5 g/m². The layer subsequently crosslinked upon drying in an oven at 110° C. for 2 minutes. Crosslinking was verified by MEK rubbing.

Color Layer Solution

Four color layer solutions were formed by combining the following ingredients in parts by weight.

| Ingredient | Color Layer | | | |
|---|---|---|---|---|
| | Cyan | Yellow | Magenta | Black |
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar 12/85 resin | 12 | 13 | 15 | 18 |
| Sartomer 369 (Sartomer Co, Hydroxyethyl isocyanurate triacrylate monomer) | 10 | 12 | 16 | 15 |
| Hostaperm B2G | 14 | — | — | — |
| Permanent Yellow GR | — | 14 | — | — |
| Permanent Red FBB | — | — | 24 | — |
| Printex 25 | — | — | — | 24 |

The pigments were dispersed in some of the Formvar 12/85 and solvents. The color solutions were coated on the crosslinked phenolic layer on the cover sheet with a Meyer rod #12 and dried. The coating weight was 0.8 g/m².

Preparation of Photoadhering Layer Solution

To prepare the polymer with ethylenically unsaturated groups useful in the photoadhering layer, 50 g of Butvat 79 polyvinyl butyral resin from Monsanto containing free hydroxyl groups (10.5–13%, expressed as % polyvinyl alcohol) was placed in 200 g of n-butyl acetate with stirring, at room temperature. To this solution, there were added 20 g of isocyanatoethyl methacrylate (Monomer, Polymer & Dajac Laboratories, Inc.), and 0.05 g of dibutyltin dilaureate as catalyst. The mixture was left stirring overnight, and after that time no isocyanante band was seen in the IR spectrum of the polymer. Thus, a polymer containing methacrylate groups was formed. To 10 g of the above stock solution, there were added 0.38 g of Sartomer 399, dipentaerythritol pentaacrylate (available from the Sartomer Co.), as monomer, and 0.1 g of 2-biphenyl-4,6-bis-trichloromethyl-s-triazine as initiator, completing the photoadhering layer formulation. The color layer was then overcoated with the photoadhering layer solution with a Meyer rod #24 and dried. The coating weight was 6.8 g/m².

The first adhesive solution was Carboset XL-37 aqueous acrylic dispersion (available from B. F. Goodrich). It was coated on the photoadhering layer with a Meyer rod #24 and dried. The coating weight was 6 g/m².

EXAMPLE 2

Yellow, magenta, cyan and black color films were prepared according to Example 1.

The yellow color film was subjected to a series of exposures of varying times to actinic radiation through the adhesive layer, using a UGRA Plate Control Wedge. After exposure, the film was laminated adhesive to adhesive to Pressmatch Gloss Cover Sheet (available from Hoechst Celanese Corporation) as a temporary receiver, using heat and pressure. Peel development by removing the support film of the color layer left a series of images of the UGRA Plate Control Wedge. Finally the above constructed image was laminated under heat and pressure, image side down, to Pressmatch Commercial Receiver which has been previously coated with a layer of polyvinyl acetate (Mowital 30 available from Hoechst) to aid in adhesion and the film support of the temporary carrier was removed. This process was repeated for the magenta, cyan and black films using separate temporary and final receiver bases for each color. The images for each of the colors thus obtained were evaluated for clear step and dot resolution. The results of this evaluation are summarized in Table 1.

TABLE 1

| Clear Step | Yellow | Magenta | Cyan | Black |
|---|---|---|---|---|
| 2 | 3–99% | 3–98% | 2–99% | 2–99% |
| 3 | 3–99% | 3–98% | 3–99% | 2–99% |
| 4 | 2–99% | 3–98% | 2–99% | 1–99% |
| 5 | 2–99% | 2–98% | 1–99% | 1–99% |
| 6 | 1–98% | 2–98% | 1–98% | 1–99% |
| 7 | 1–98% | 2–97% | 1–97% | 1–99% |

EXAMPLE 3

(COMPARATIVE)

Yellow, magenta, cyan and black color films were prepared according to Example 1.

The yellow color film was laminated to Pressmatch Commercial Receiver base, exposed for varying times to actinic radiation through the transparent cover sheet using a UGRA Plate Control Wedge and developed by peeling away the cover sheet, leaving a series of images of the UGRA target.

This process was repeated with the magenta, cyan and black color films, laminating each color on a separate base. The images for each of the colors thus obtained were evaluated for clear step and dot resolution. The results of this evaluation are summarized in Table 2.

TABLE 2

| Clear Step | Yellow | Magenta | Cyan | Black |
|---|---|---|---|---|
| 2 | 3–98% | 3–98% | 3–98% | 10–99% |
| 3 | 3–98% | 3–98% | 3–98% | 10–99% |
| 4 | 2–97% | 3–97% | 3–97% | 4–98% |
| 5 | 2–96% | 2–96% | 3–96% | 3–98% |
| 6 | 2–95% | 2–95% | 2–95% | 2–96% |
| 7 | 2–90% | 2–90% | 2–90% | 2–90% |

A comparison of the results obtained by following the process of the invention in Example 2 as compared to the comparative method of Example 3 shows that in order to obtain a commercially acceptable 3–97% dot resolution, the invention can vary exposure over six exposure steps, i.e. steps 2–7, for all four colors. In contrast, such resolution can only be obtained over three steps, i.e. steps 2–4, for the comparative image forming method.

EXAMPLE 4

This example demonstrates the preparation of a four color proof using the process of this invention. Yellow, magenta, cyan and black films, prepared as in the above examples, were exposed simultaneously for the same exposure time through their adhesive layers, using the corresponding color separation negative for each of the colors. The black film was laminated, adhesive to adhesive, to a sheet of Pressmatch Gloss Cover Sheet, and developed by peeling off its clear support layer. The cyan film was next laminated in register to the black image, and again developed by peeling. These lamination and development steps were repeated for the magenta and yellow images to yield a four color image on the Pressmatch Gloss Cover Sheet. This four color sandwich was next laminated to Pressmatch Commercial Receiver, which has been previously coated with polyvinyl acetate, as in Example 1. Removal of the clear film support from the Cover Sheet yielded a well resolved reproduction of the original image, with all colors showing good dot reproduction.

What is claimed is:

1. A method for producing a negative image which comprises:
    (A) providing a photosensitive element which comprises, in order from top to bottom:
        (i) a dimensionally stable cover sheet;
        (ii) a crosslinked release layer adhered to the cover sheet, which release layer comprises a polymer having phenolic groups;
        (iii) a color layer, which comprises an organic binder, an unsaturated monomer capable of addition polymerization, a colorant, and optionally, a photoinitiator, wherein the binder is present in sufficient amount to bind the color layer components into a uniform film, wherein the optional photoinitiator, when present, is present in a sufficient amount to initiate polymerization of the polymerizable monomer, wherein the polymerizable monomer is present in sufficient amount to provide image differentiation when the element is imagewise exposed to actinic radiation and wherein the colorant is present in an amount sufficient to uniformly color the color layer;
        (iv) a photoadhering layer, which comprises a photosensitive polymer having ethylenically unsaturated, photocrosslinkable groups and a molecular weight greater than about 3,000, a polymerizable monomer having at least one ethylenically unsaturated group, and an optional photoinitiator, wherein the optional photoinitiator, when present, is present in sufficient amount to initiate polymerization of the polymerizable monomer and the crosslinking of the photosensitive polymer; and wherein at least one of either the color layer and the photoadhering layer contains a photoinitiator; and
        (v) a first thermoplastic adhesive layer;
    (B) positioning a photomask onto the first thermoplastic adhesive layer and imagewise exposing the color layer and the photoadhering layer to actinic radiation through the first thermoplastic adhesive layer and photomask;
    (C) removing the photomask from the photosensitive element;
    (D) laminating the photosensitive element to a temporary receiver sheet, which temporary receiver sheet comprises a smooth substrate having a second thermoplastic adhesive layer thereon, said lamination being conducted by adhering the first thermoplastic adhesive layer to the second thermoplastic adhesive layer with heat and pressure;
    (E) peeling apart the temporary receiver sheet and the cover sheet, leaving exposed areas of the color layer attached to the temporary receiver sheet via the photoadhering layer and first and second adhesive layers and the unexposed areas being removed with the cover sheet and the crosslinked phenolic layer, thereby forming a colored negative image on the temporary receiver sheet; and
    (F) optionally repeating steps (A) through (E) at least once wherein another photosensitive element having at least one different colorant, is transferred via its photoadhering and first thermoplastic adhesive layers to the image previously produced on the temporary receiver sheet; and
    (G) laminating the temporary receiver sheet to a permanent receiver sheet via the images with heat and pressure;
    (H) optionally overall exposing the image to actinic radiation;
    (I) optionally peeling away the substrate of the temporary receiver sheet.

2. The method of claim 1 wherein the cover sheet comprises polyethylene terephthalate.

3. The method of claim 1 wherein the release layer comprises a crosslinked novolak resin, cresol-formaldehyde resin, polyhydroxystyrene homopolymer, polyhydroxystyrene containing polymer, or an acrylic polymer containing phenolic groups.

4. The method of claim 1 wherein the color layer comprises one or more organic binders selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

5. The method of claim 1 wherein the unsaturated monomer component in steps A(iii) and A(iv) comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6- hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, bisphenol A diepoxide dimethacrylate and bisphenol A diepoxide diacrylate.

6. The method of claim 1 wherein the color layer comprises a pigment.

7. The method of claim 1 wherein both the color layer and the photoadhering layer contain a photoinitiator.

8. The method of claim 1 wherein the photoinitiator component in steps A(iii) and A(iv) comprises one or more photoinitiators selected from the group consisting of 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazine, acetophenones, thioxanthones and their derivatives.

9. The method of claim 1 wherein the color layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

10. The method of claim 1 wherein the photoadhering layer comprises a photosensitive polymer selected from the group consisting of an acrylate or methacrylate containing polymer.

11. The method of claim 1 wherein the photoadhering layer comprises a photosensitive polymer selected from the group consisting of an adduct of an acetal resin containing hydroxy groups and isocyanatoethyl methacrylate; the reaction product of a hydroxy containing acetal resin with acrylic anhydride, methacrylic anhydride, acrylic acid, methacrylic acid or acryloyl chloride and acrylated or methacrylated polyvinyl acetal polymers.

12. The method of claim 1 wherein the photoadhering layer further comprises one or more ingredients selected from the group consisting of plasticizers, tackifiers, stabilizers, antistatic compositions, uv absorbers, spectral sensitizers, optical brighteners, inert fillers, exposure indicators, polymerization inhibitors, surfactants, hydrogen atom donors, antihalation agents, and photoactivators.

13. The method of claim 1 wherein each of the first and second thermoplastic adhesive layers independently comprise a thermoplastic resins selected from the group consisting of acrylic polymers, polyvinyl acetate/crotinic acid copolymers, polyvinyl pyrrolidone/polyvinyl acetate copolymers, polyvinyl acetate polymers, styrene/maleic anhydride copolymers, and urethane polymers.

14. The method of claim 1 wherein each of the first and second thermoplastic adhesive layers independently comprise one or more components selected from the group consisting of a plasticizer and a uv absorber.

15. The method of claim 1 wherein each of the first and second thermoplastic adhesive layers are substantially non-tacky at room temperature.

16. The method of claim 1 wherein the substrate of the temporary receiver sheet comprises a substrate comprises a material selected from the group consisting of polyester, paper, polyethylene coated, wood, glass, metal and paper.

17. The method of claim 1 wherein the substrate of the temporary receiver sheet is transparent.

18. The method of claim 1 wherein the permanent receiver sheet is a white opaque material comprising paper, coated paper, or a polymeric film.

19. The method of claim 1 wherein the binder is present in the color layer in an amount ranging from about 20% to about 80% by weight of the dried color layer; the unsaturated monomer is present in the color layer in an amount ranging from about 5% to about 50% by weight; the photoinitiator component is present in an amount ranging from about 0.01 to 20% by weight; the colorant is present in an amount of from about 5 to about 50% by weight; and wherein the dried coating weight of the color layer ranges from about 0.1 to about 5 g/m$^2$.

20. The method of claim 1 wherein the photosensitive polymer is present in the photoadhering layer in an amount ranging from about 1% to about 30% based on the weight of the dried photoadhering layer; the polymerizable monomer is present in the photoadhering layer in an amount ranging from about 10% to about 40% by weight; wherein the photoinitiator is present in the photoadhering layer in an amount ranging from about 5% to about 20% by weight; and wherein the dried coating weight of the photoadhering layer ranges from about 2 to 20 g/m$^2$.

21. The method of claim 1 wherein the cover sheet comprises polyethylene terephthalate; the release layer comprises a crosslinked novolak resin, cresol-formaldehyde resin, polyhydroxystyrene homopolymer, polyhydroxystyrene containing polymer, or an acrylic polymer containing phenolic groups; wherein the color layer comprises one or more organic binders selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers; wherein the unsaturated monomer component in steps A(iii) and A(iv) comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, bisphenol A diepoxide dimethacrylate and bisphenol A diepoxide diacrylate; wherein the color layer comprises a pigment; wherein the photoinitiator component in steps A(iii) and A(iv) comprises one or more photoinitiators selected from the group consisting of 2,3-di(4-methoxyphenyl) quinoxaline, 9-phenylacridine, 2-biphenyl-4,6-bis-trichloromethyl-5-triazine, bis(2,4,5-triphenyl)imidazole, bis-trichloromethyl-s-triazine, acetophenones, thioxanthones and their derivatives; wherein the photoadhering layer comprises a photosensitive polymer selected from the group consisting of an adduct of an acetal resin containing hydroxy groups and isocyanatoethyl methacrylate; the reaction product of a hydroxy containing acetal resin with acrylic anhydride, methacrylic anhydride, acrylic acid, methacrylic acid or acryloyl chloride and acrylated or methacrylated polyvinyl acetal polymers; wherein each of the first and second thermoplastic adhesive layers independently comprise a thermoplastic resins selected from the group consisting of acrylic polymers, polyvinyl acetate/crotinic acid copolymers, polyvinyl pyrrolidone/polyvinyl acetate copolymers, polyvinyl acetate polymers, styrene/maleic anhydride copolymers, and urethane polymers; wherein the substrate of the temporary receiver sheet comprises a substrate comprises a material selected from the group consisting of polyester, paper, polyethylene coated, wood, glass, metal and paper; and wherein the permanent receiver sheet is a white opaque material comprising paper, coated paper, or a polymeric film.

22. The method of claim 1 wherein the release layer comprises a poly-p-hydroxystyrene crosslinked by a melamine-formaldehyde resin in the presence of a of p-toluene sulfonic acid catalyst; the color layer comprises a pigment, a photosensitive polymer which is a urethane adduct of 1 mole equivalent of trimethylhexamethylene diisocyanate with 2 mole equivalents of 2-hydroxyethyl-4,6-bis-acryloxyethyl isocyanurate, 2-biphenyl-4,6-bis-trichloromethyl-s-triazine photoinitiator, and a polyvinyl formal binder; the photoadhering layer comprises a photosensitive polymer comprising the reaction product of a polyvinyl butyral polymer containing free hydroxyl groups with isocyanatoethyl methacrylate in the presence of dibutyltin dilaureate catalyst, a polymerizable monomer which is dipentaerythritol pentaacrylate and a photoinitiator which is 2-biphenyl-4,6-bis-trichloromethyl-s-triazine.

23. The method of claim 22 wherein the cover sheet and temporary receiver sheet comprise polyethylene terephthalate; the first and second thermoplastic adhesive layers comprise an acrylic polymer, and wherein the permanent receiver sheet is a white, opaque material.

* * * * *